United States Patent
Vaufrey et al.

(10) Patent No.: US 7,759,857 B2
(45) Date of Patent: Jul. 20, 2010

(54) ACTIVE-MATRIX DISPLAY WITH ELECTROOPTIC ELEMENTS HAVING LOWER BILAYER ELECTRODES

(75) Inventors: David Vaufrey, Rennes (FR); Benoit Racine, Renage (FR)

(73) Assignee: Thomson Licensing, Boulogne Billancourt (FR)

(*) Notice: Subject to any disclaimer, the term of this patent is extended or adjusted under 35 U.S.C. 154(b) by 568 days.

(21) Appl. No.: 11/402,016

(22) Filed: Apr. 11, 2006

(65) Prior Publication Data
US 2006/0244680 A1 Nov. 2, 2006

(30) Foreign Application Priority Data
Apr. 14, 2005 (FR) ................................. 05 50955

(51) Int. Cl.
*H01J 1/62* (2006.01)
(52) U.S. Cl. .................... 313/504; 428/690; 445/50
(58) Field of Classification Search ......... 313/500–512; 156/230; 362/560
See application file for complete search history.

(56) References Cited

U.S. PATENT DOCUMENTS 5,723,873 A 3/1998 Yang

| | | |
|---|---|---|
| 2002/0025391 A1 | 2/2002 | Angelopoulos et al. |
| 2004/0012980 A1* | 1/2004 | Sugiura et al. ............ 362/560 |
| 2004/0140757 A1* | 7/2004 | Tyan et al. ................ 313/504 |
| 2005/0007015 A1 | 1/2005 | Yokoyama et al. |
| 2005/0045269 A1* | 3/2005 | Tateishi .................... 156/230 |
| 2005/0062409 A1* | 3/2005 | Yamazaki et al. ......... 313/504 |

FOREIGN PATENT DOCUMENTS

EP 1369936 12/2003

OTHER PUBLICATIONS

Search Report Dated Aug. 2, 2005.

* cited by examiner

*Primary Examiner*—Nimeshkumar D Patel
*Assistant Examiner*—Mary Ellen Bowman
(74) *Attorney, Agent, or Firm*—Robert D. Shedd; Patricia Verlangieri

(57) ABSTRACT

In this display, an upper electrical insulation layer covers the active matrix; each electrooptic element comprises a lower supply electrode that is applied to this insulation layer. According to the invention, this lower electrode includes an organic conducting layer applied directly to said insulation layer and a metal layer covering the organic conducting layer.

Such a structure makes it possible to optimize both planarization and light extraction by an optical cavity effect thereby improving the performance of the display.

10 Claims, 2 Drawing Sheets

ACTIVE-MATRIX DISPLAY WITH ELECTROOPTIC ELEMENTS HAVING LOWER BILAYER ELECTRODES

This application claims the benefit, under 35 U.S.C. §119 of French Patent Application 0550955, filed Apr. 14, 2005.

FIELD OF THE INVENTION

The invention relates to an active-matrix display comprising a substrate that supports:

an array of circuits for supplying and driving electrooptic elements, and arrays of electrodes for driving each of the circuits and for supplying electrooptic elements through these circuits, these circuits and electrodes therefore forming an active matrix;

an upper electrical insulation layer covering the arrays of circuits and electrodes; and an array of electrooptic elements placed on the insulation layer.

In such a display, each circuit corresponds to an electrooptic element and is intended to drive this element. Each circuit includes a supply input terminal connected to a supply electrode of one of the electrode arrays and a supply output terminal. Each circuit includes, for example, the current modulator of the TFT transistor type comprising two current electrodes, called in this case the drain and source electrodes, one serving as input terminal and the other as output terminal.

Each electrooptic element comprises an upper supply electrode and a lower supply electrode that is applied to the insulation layer and is connected to the supply output terminal of the circuit corresponding to this element through a through-hole that passes through said insulation layer. Such through-holes are generally called "vias".

DESCRIPTION OF THE PRIOR ART

Document U.S. Pat. No. 6,780,688 describes a display of the aforementioned type, in which the electrooptic elements are organic electroluminescent diodes and in which, consequently, an organic electroluminescent layer is inserted between the lower electrode and the upper electrode of each diode.

Referring to the attached FIG. 1, the active-matrix electroluminescent display described in that document comprises a substrate 1 and, at each diode, a TFT transistor 12 comprising two current electrodes and a storage capacitor 13 that are components of a circuit for driving this diode, an upper electrical insulation layer 14 covering this circuit, which, as the figure illustrates, has the function of planarizing the features formed by the components 12, 13 of the circuit, a lower electrode 16, serving here as anode, applied to the insulation layer 14, an electroluminescent layer 17, an upper electrode 18, common to all the diodes, serving here as a cathode, and a protective layer 19. The substrate 1 and the drive/supply circuits form an active matrix 11 for the array of diodes. The upper electrode 18 and the protective layer 19 are transparent to the light emitted by the diodes. The lower supply electrode 16 for each diode is connected to a current electrode of the TFT transistor of the circuit that corresponds to it by means of a via 20, which in particular passes through the insulation layer 14.

Such a structure has several drawbacks:

the insulation layer must be relatively thick so that the volume of material applied in order to form this layer may completely fill the features formed by the components of the circuits and the electrodes of the active matrix. Furthermore, this insulating material must be suitable for being applied so as to fill the features, for example by spin coating, which may require the use of a solvent;

when the lower electrode itself provides, as illustrated in FIG. 1, contact with the TFT transistor 12 through vias 20, a replica 21 of this via is transferred to the upper face of this lower electrode and forms a depression relative to the plane surface of the electrode. On the contours of these hollow replicas 21, the abrupt breaks in slope induce parasitic electrical contacts between thin films, especially those of the diodes, thereby generating leakage currents and degrading the performance of the display.

SUMMARY OF THE INVENTION

It is an object of the invention to avoid one and/or other of the aforementioned drawbacks, especially by better planarizing the upper face of the lower electrodes.

In particular for this purpose, the invention proposes the addition to the lower electrode itself of a planarization function which may even, according to one advantageous embodiment, replace that provided by the insulation layer.

For this purpose, the subject of the invention is a display comprising a substrate that supports:

an active matrix;

an upper electrical insulation layer covering said active matrix; and an array of electrooptic elements placed on said insulation layer, each including a lower supply electrode applied to said insulation layer (14; 14'), characterized in that said lower supply electrode (16; 16") of each electrooptic element includes an organic conducting layer (161; 161') applied directly to said insulation layer (14; 14') and a metal layer (162) covering the organic conducting layer.

The active matrix generally comprises an array of circuits for supplying and driving the electrooptic elements, and arrays of electrodes for driving each of said circuits and for supplying these electrooptic elements via said circuits.

The insulation layer is applied so as to be in contact with the circuits and with the electrodes of this active layer, especially so as to electrically isolate the components of these circuits and these electrodes.

The insulation layer, which may be structured in the form of several sublayers, is therefore inserted between the active matrix, especially the circuits and the electrodes that it comprises, and the lower electrodes of the electrooptic elements.

The lower electrodes of the electrooptic elements are in direct contact with the insulation layer.

Each electrooptic element generally includes an upper electrode. The electrooptic elements are for example electroluminescent diodes or liquid-crystal cells. Each electrooptic element therefore preferably has a layer of electrooptic material such as electroluminescent or liquid-crystal material, which is inserted between its lower electrode and its upper electrode. Preferably, the upper electrodes form one and the same common electrode for supplying all of the electrooptic elements.

Since the insulation layer directly covers the active matrix, the components of its circuits and its electrodes form features on the substrate that are generally transposed to the top of the insulation layer, especially when this layer has a small thickness compared with the magnitude of these features, and/or especially when this layer has a uniform thickness as a result of the application method used.

Thanks to the organic conducting layer of the lower electrodes, the features of the active matrix are planarized. This results in lower electrodes of greater planarity than in the prior art and contributes to improving the performance of the electrooptic elements provided with these electrodes.

The following documents of the prior art U.S. Pat. No. 6,586,764, U.S. Pat. No. 5,723,873 and U.S. Pat. No. 5,719,467 also propose a two-layer lower electrode, one layer of which is also made of an organic conducting material but is inserted, unlike the invention, between the other layer, for example made of ITO, in contact with the substrate, and the electroluminescent layer of the diodes. To fulfil a planarization function, it is important for the thickness of such an organic conducting layer to be greater than the magnitude of the features to be planarized. Such a thickness runs the risk of no longer being compatible with the constructive, especially first-order, interference criteria in the optical resonant cavities that are formed within each diode and make it possible to optimize the level of light extraction. The improvement in planarity of the lower electrodes therefore runs the risk of being at the expense of light extraction, and the overall performance of the diodes will not be improved.

Preferably, each electrooptic element also includes an upper electrode, and said electrooptic elements are electroluminescent diodes each having at least one organic electroluminescent layer inserted between the lower electrode and this upper electrode. Preferably, for each diode, the lower electrode is reflecting towards the light emitted by this diode and the upper electrode is semireflecting towards the same light and the distance between these electrodes is suitable for forming, between these electrodes, a resonant optical cavity for said emitted light.

Preferably, said distance is equal to 80 nm or less. This condition expresses a first-order resonance for the emitted light. Since, according to the invention, the organic conducting layer of the lower electrodes is placed outside the resonant optical cavities formed in each diode, construction benefits from the entire desired latitude for obtaining the required planarization effect, without the risk of impairing the tuning of the optical cavity and the light extraction performance. The means for obtaining an optimum optical cavity and the means for obtaining optimum planarization are completely separate. It should be noted that document US2002/025391 makes no mention of this problem of the prior art making the difficult compromise between planarity and light extraction, because the electrooptic elements it deals with are liquid-crystal cells.

Preferably, each electrooptic element also includes an upper electrode that is transparent or partially transparent to visible light, and the lower electrode of this element is reflecting or partially reflecting for visible light through said element.

The metal layer covering the organic conducting layer of the lower electrode for supplying each electrooptic element therefore serves for reflecting visible light, something which is not generally possible by using lower electrodes formed from a single organic conducting layer as in documents U.S. Pat. No. 5,705,888 and U.S. Pat. No. 5,719,467 (a variant).

If the electrooptic elements are liquid-crystal cells, these cells therefore operate by reflection. For example, the display may be of the LCOS (liquid crystal on silicon) type. If the electrooptic elements are electroluminescent diodes, the display is then of the "top-emitting" type, that is to say the light is emitted by the diodes on the opposite side from the substrate.

The bilayer structure of the lower electrode for supplying each electrooptic element therefore has the following advantages, an organic conducting layer for the planarization;

a metal layer, the metal of which is suitable, especially as regards its work function, for optimizing, in a manner known per se, the electrical properties of the junction with the organic electroluminescent layer, in general via a carrier injection or transport layer that is generally in contact with this metal layer.

This carrier injection or transport layer is therefore inserted between the lower electrode and the electroluminescent layer of each diode. The carriers are electrons if the lower electrode is a cathode, or they are holes if the lower electrode is an anode.

As a variant, for each diode, the upper electrode is a cathode and the lower electrode is an anode. This is therefore a conventional structure.

In another variant, for each diode, the upper electrode is an anode and the lower electrode is a cathode. It is therefore an inverted structure.

Preferably, said display comprises only a single substrate (1) supporting both said active matrix and the diode array. Thus, the diode array is attached to the single substrate and not, at least in part, also to another "upper" substrate which would be placed on the opposite side from the substrate supporting the active layer. This means that the organic electroluminescent layers and, where appropriate, the carrier transport and/or injection layers are deposited, during fabrication of the display, on the metal layers of the lower electrodes, in which case the organic materials of these layers have not penetrated significantly into the metal of the metal layers. Conversely, if there is an "upper" substrate, it is on this substrate that the various layers of the diodes, including the electrodes, would have been deposited, and the organic materials of the organic layers would then have penetrated into the metal of the metal layers of the lower electrodes.

The display according to the invention nevertheless may be provided with a protective encapsulation layer, which then covers the upper electrodes, this layer therefore being transparent to the light emitted by the diodes. The diodes are then inserted between the single substrate and this layer. This protective encapsulation layer may be a rigid or flexible sheet.

Preferably, away from any vias passing through the insulation layer, the insulation layer has a constant thickness that varies by no more than 10% over its area. This insulation layer may be subdivided into several sublayers, which comprise the set of insulating sublayers lying between the upper parts of the circuits or electrode arrays of the active matrix and the lower electrodes of the electrooptic elements. The overall thickness of this layer is then in particular identical at the location of the aforementioned features, and alongside these features. Consequently, the insulation layer therefore provides virtually no planarization function. It appears that the organic conducting layer of the lower electrodes therefore provides almost entirely the planarization function that enhances the performance of the electrooptic elements.

Preferably, the thickness of said insulation layer is equal to 100 nm or less. Such a low overall thickness of this insulation layer generally no longer allows this layer to provide any planarization function, thereby further enhancing the benefit of the organic conducting layer of the lower electrode of each electrooptic element for obtaining sufficient planarity of the lower electrodes of the electrooptic elements.

Preferably, said insulation layer is made of inorganic material. As inorganic material, it is possible to use for example silica, silicon nitride, tantalum oxide ($Ta_2O_5$), or other materials, preferably having a high dielectric permittivity. Inorganic materials are advantageously much more stable than organic materials. Advantageously, an insulating material suitable for providing, as described in documents U.S. Pat. No. 6,597,111 and U.S. Pat. No. 6,765,351 (column 6, lines 20-27), a diffusion barrier function, which prevents the risk of mutual contamination between the drive/supply circuits for the active matrix and the electrooptic elements, is chosen. Given their usual mode of application for forming layers, such inorganic materials are ill-suited for providing a planarization function, thereby further enhancing the benefit of the organic conducting layer of the lower electrode of each electrooptic element for obtaining sufficient planarity of the lower electrodes of the electrooptic elements.

Preferably, the active matrix comprises an array of circuits for supplying and driving the electrooptic elements, each circuit having a supply output terminal, and the organic conducting layer of the lower supply electrode of each electrooptic element passes through, by means of a via, said insulation layer so as to electrically connect said lower electrode of this electrooptic element to the supply output terminal of one of the circuits for supplying and driving the active matrix. The organic conducting layer of the lower electrodes thus penetrates into each via until coming into contact with a supply output terminal of a circuit. This layer then has two functions—planarization and electrical connection of the output terminals of the circuits to the lower electrodes. Advantageously, this thus dispenses with a specific step of depositing connectors (often called vias) in each of the holes before deposition of the organic conducting layer.

Each supply/drive circuit generally also includes a supply input terminal connected to a supply electrode of one of the arrays of electrodes for the active matrix.

BRIEF DESCRIPTION OF THE DRAWING

The invention will be more clearly understood on reading the description that follows, given by way of non-limiting example, and with reference to the appended drawings in which.

To simplify the description and to bring out the differences and advantages that the invention affords over the prior art, identical references are used for the elements that fulfil the same functions.

DESCRIPTION OF THE PREFERRED EMBODIMENTS

Figure 1:
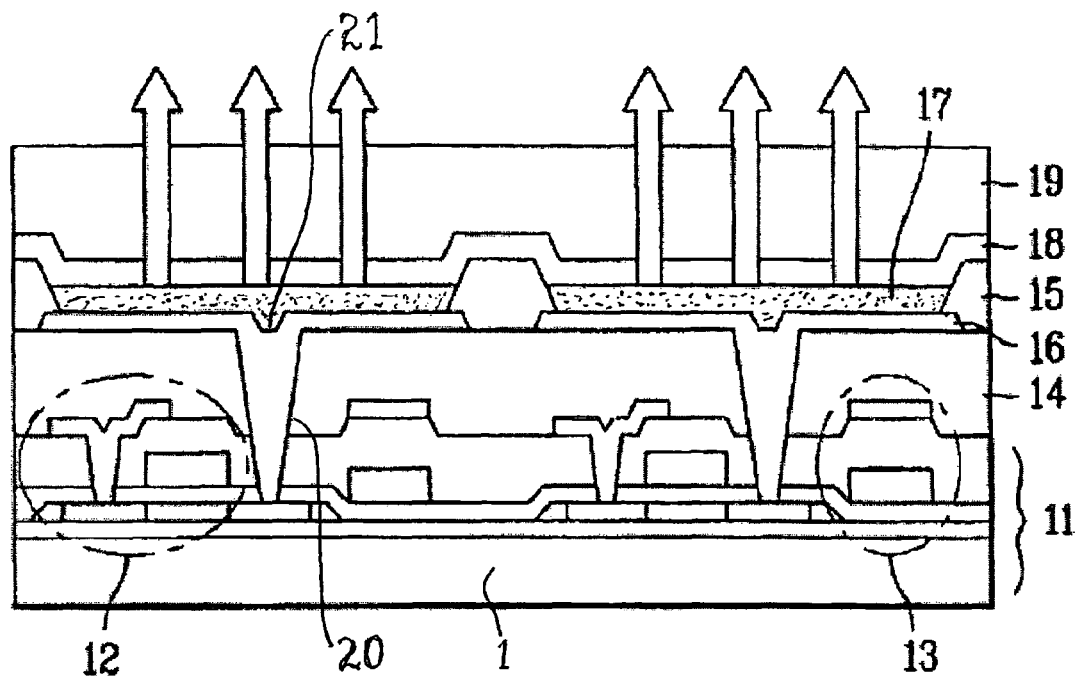
FIG. 1, already described, illustrates, in cross section, an active-matrix display of the prior art.
Figure 2:
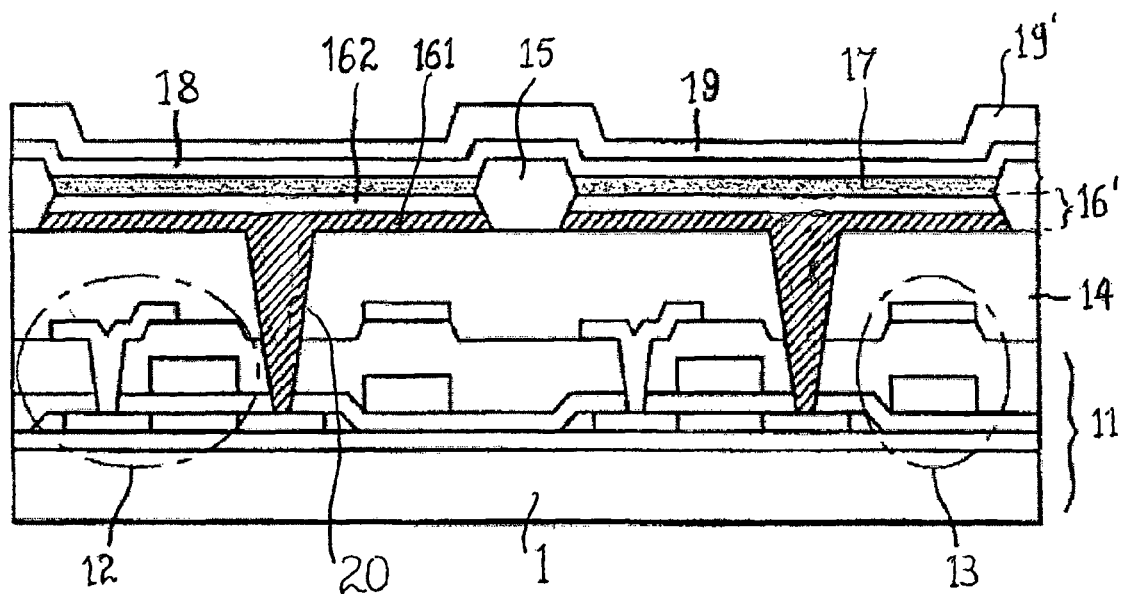
FIG. 2 illustrates, in cross section, a first embodiment of the invention in which the insulation layer serves for planarizing, as in the prior art.

The fabrication of a display according to a first embodiment of the invention will now be described with reference to FIG. 2.

An active matrix 11 produced in an identical way to that described in document U.S. Pat. No. 6,780,688 already mentioned, on which an upper insulation layer 14 is formed by applying, as in the prior art and as illustrated in the figure, a sufficiently large volume of insulating material for planarizing the features formed by the circuits and the electrodes (not shown) integrated into the matrix. As in the prior art, at a current electrode for each TFT transistor for modulating the current in each circuit, vias 20 are formed through the upper insulation layer 14 and through other possible subjacent insulation layers. Again as in the prior art, an array of separating barriers 15 defining the locations of the diodes is formed.

At the location of each diode, a layer of organic conducting material 161 is applied so that this material penetrates to the bottom of the vias 20 and ensures electrical contact of the lower electrodes with a current electrode of the TFT 12 of each circuit for driving the active matrix 11. An organic material having a suitable conductivity for giving the layer sufficient conductance for the lower electrode function is chosen in a manner known per se.

The organic conducting material of this layer is preferably chosen from the group formed by the following polymers and their blends: polythiophene, polypyrrole, polyamine, polyaniline and polyacetylene. Where appropriate, these polymers are doped and/or blended with other compounds in a manner known per se in order to obtain the desired level of conductivity.

Thanks to the use according to the invention of an organic material as lower layer of the lower electrodes of the electrooptic elements of the display, which here are diodes, very much better planarization of these electrodes to that in the prior art is obtained. In particular, it is found that the hollow replicas 21 of the vias 20 have virtually disappeared.

A metal layer 162 is applied to the organic conducting layer 161 thus deposited, which metal layer therefore is very well planarized.

Deposited on this metal layer 162 are, as in the prior art, an organic electroluminescent layer 17, an upper layer 18, here common to all the diodes, and a protective layer 19'.

At each diode of the display thus obtained, the organic conducting layer 161 and the metal layer 162 form the lower electrode 16' of this diode.

The organic electroluminescent layer 17 generally comprises several sublayers, including a carrier transport and/or injection sublayer, electrons on the cathode side and holes on the anode side, on either side of a specifically emissive organic sublayer.

Thus, one of the carrier transport and/or injection sublayers is in direct contact with the metal layer 162 of the lower electrode 16.

The metal of the metal layer is chosen, in a manner known per se, so as to obtain the best properties for injecting carriers into the electroluminescent layer 17, especially into the carrier transport and/or injection sublayer with which this metal is in direct contact. The work function of the metal is a well-known criterion for choosing it.

Preferably, the thickness of this metal layer 162 is sufficient for obtaining a reflecting effect for the light emitted by the electroluminescent layer 17. There is therefore an optical cavity between this metal layer 162 and the upper electrode 18, especially when this upper electrode is semireflecting.

To improve extraction of the light emitted by the diodes, it is known to adjust the height of this optical cavity and the position of the emissive sublayer in this cavity, as described for example in the documents U.S. Pat. No. 6,505,901, EP 1 154 676, US 2003/122481, WO 2004/034750, EP 1 406 315, EP 1 439 589, EP 1 443 572. Resonant optical cavities with a height of generally around 70 to 80 nm are therefore obtained. This adjustment results in the thickness of the various sublayers lying between the electrodes being fixed so that the sum of these thicknesses therefore does not exceed 70 to 80 nm. This total thickness of 70 to 80 nm does not leave much room for an effective planarization layer. This is why, according the invention, the planarization layer is placed outside the gap between the electrodes. Because, according to the invention, the organic conducting layer 161 of the lower electrode lies outside the optical cavity, unlike the organic layers of the electrodes described in U.S. Pat. No. 6,586,764, U.S. Pat. No. 5,723,873 and U.S. Pat. No. 5,719,467 mentioned above, this organic conducting layer 161 is not involved in tuning the optical cavity. Consequently, the structure benefits from the entire desired latitude for obtaining the required planarization effect, without any risk of impairing the tuning of the optical cavity and the light extraction performance. The means for obtaining an optimum optical cavity and the means for obtaining optimum planarization are completely separate.

Figure 3:
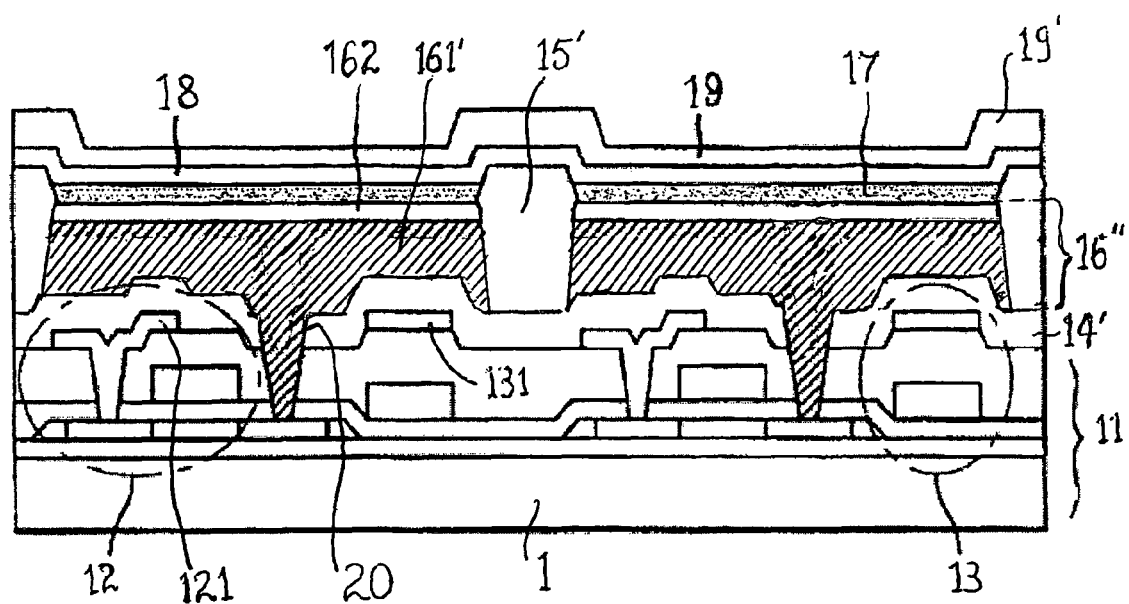
FIG. 3 illustrates, in cross section, a second embodiment of the invention in which the insulation layer is much thinner than in the prior art and no longer serves for planarizing.

The function of planarizing the organic conducting layer of the lower electrode may even substitute that of the insulation layer 14, as illustrated by the second embodiment of the invention, which will now be described with reference to FIG. 3.

As illustrated in this figure, this embodiment differs from the first embodiment only in that:

the thickness of the upper insulation layer 14', deposited on the active matrix 11, is much smaller than previously, being in particular 100 nm or less, and/or has an approximately constant value, especially to within 10%, over its entire area. This thickness means in practice the overall thickness of insulating material lying between, on the one hand, the upper electrodes 121, 131 integrated into the active matrix 11 of the components 12, 13 of the supply/drive circuits and, on the other hand, the organic conducting layer 161" of the lower electrode 16 of the diodes. According to a variant, this insulation layer 14' may be distributed as several insulating sublayers; and the thickness of the organic conducting layer 161' of the lower electrode 16" of the diodes is however higher than previously, preferably equal to 100 nm or more, and has a sufficient volume and a thickness that varies so as to planarize the features formed, especially by the components 12, 13 of the drive/supply circuits for the active matrix 11.

As organic conducting material for this layer 161', a conducting polymer suitable for planarization is chosen in a manner known per se. Preferably, PEDOT-PSS, that is to say a blend of poly(3,4-ethylenedioxythiohene) and polystyrenesulphonate, is used. This conducting polymer is known for being applicable for liquid processing—the layer of organic conducting material is therefore applied by liquid processing, thereby making it possible to achieve the desired filling of the features easily.

In a first variant of the first or second embodiment, the step of producing the separating barriers 15 is eliminated. In this case, on the insulation layer 14, 14', a continuous organic layer with no holes (that is to say no "apertures"—called a "full layer") is deposited over the entire active surface of the display, and produced in this layer are conducting polymer features electrically isolated from one another so as to end up with the same features of organic conducting layers 161, 161' as previously. For this purpose, one or other of the methods described in documents U.S. Pat. No. 5,705,888 and EP 0 727 100 is used. As explained in those documents, it does not matter whether the starting material is an insulating continuous organic layer with the zones corresponding to the lower electrodes of the diodes made conducting, or, conversely, a conducting continuous organic layer with the inter-diode zones lying between the zones corresponding to the lower electrodes of the diodes made insulating.

A metal layer 162 is applied to the organic conducting layer 161 thus deposited, said metal layer being applied for example by vacuum deposition with interposition of a suitable mask positioned so as to deposit metal only at the location of the diodes. It is a known method for depositing electrodes.

The procedure then continues as described above.

A display in which the organic conducting layer 161' is continuous is therefore obtained. Despite the continuity of this layer, it is possible to maintain sufficient electrical insulation between the lower electrodes using an organic material exhibiting anisotropic conductivity, being substantially more conducting transversely than along its surface, and/or for maintaining a sufficient distance between the elements of the metal layer 162 that are specific to each electrode.

One advantageous means for obtaining good electrical insulation between the lower electrodes consists in eliminating those parts of the organic conducting layer that lie between the elements of the metal layer 162: after the elements of the metal layer 162 have been deposited, a plasma etching treatment is applied for example, which degrades and eliminates the organic conducting layer parts lying between the elements of the metal layer 162 without significantly affecting the elements of the metal layer 162 and the subjacent elements of the organic conducting layer 161'.

This variant, with its subvariants, has the advantage of eliminating the step of producing separating barriers and of also resulting in better planarity of the upper surface of the display.

The present invention has been described with reference to a top-emitting active-matrix electroluminescent display. It is obvious to a person skilled in the art that it may apply to other types of display without departing from the scope of the claims appended hereto.

The invention claimed is:

1. A display comprising a substrate that supports:
   an active matrix formed on said substrate;
   an upper electrical insulation layer covering said active matrix; and
   an array of electrooptic elements placed on said insulation layer, wherein each electrooptic element includes a lower supply electrode applied to said insulation layer, wherein said lower supply electrode includes an organic conducting layer contacting directly said upper insulation layer and a metal layer covering the organic conducting layer,
   wherein the display includes features that are formed on the substrate, that are transposed through the insulation layer, and that are planarized by the organic conducting layer of said lower supply electrodes, and
   wherein, away from any vias gassing through this insulation layer, this insulation layer has a constant thickness that varies by no more than 10% over its area.

2. Display according to claim 1, wherein each electrooptic element also includes an upper electrode and wherein said electrooptic elements are electroluminescent diodes each having at least one organic electroluminescent layer inserted between the lower electrode and the upper electrode of this diode.

3. Display according to claim 2, wherein, for each diode, the lower electrode is reflecting towards the light emitted by this diode and the upper electrode is semireflecting towards the same light.

4. Display according to claim 2, wherein for each diode, the distance between the lower electrode and the upper electrode is suitable for forming, between these electrodes, a resonant optical cavity for the light emitted by this diode.

5. Display according to claim 4, wherein said distance is equal to 80 nm or less.

6. Display according to claim 1, wherein said display comprises only a single substrate supporting both said active matrix and the diode array.

7. Display according to claim 1, wherein the thickness of said insulation layer is equal to 100 nm or less.

8. Display according to claim 1, wherein said insulation layer is made of inorganic material.

9. Display according to claim 1, wherein, when the active matrix includes an array of circuits for supplying and driving the electrooptic elements, each circuit having a supply output terminal, said organic conducting layer of the lower supply electrode of each electrooptic element passes through, by means of a via, said insulation layer so as to electrically connect said lower electrode of this electrooptic element to the supply output terminal of one of the circuits for supplying and driving the active matrix.

10. Display according to claim 1, wherein the active matrix includes an array of circuits comprising components for supplying and driving the electrooptic elements, and arrays of electrodes for driving said circuits and for supplying these electrooptic elements via said circuits, wherein said features comprises some of said components and/or said electrodes.

* * * * *